(12) United States Patent
Xia

(10) Patent No.: US 11,482,972 B2
(45) Date of Patent: Oct. 25, 2022

(54) POWER SUPPLY FOR RADIO-FREQUENCY POWER AMPLIFIER

(71) Applicant: SHAANXI REACTOR MICROELECTRONICS CO., LTD, Xi'an (CN)

(72) Inventor: Qin Xia, Xi'an (CN)

( * ) Notice: Subject to any disclaimer, the term of this patent is extended or adjusted under 35 U.S.C. 154(b) by 92 days.

(21) Appl. No.: 17/060,290

(22) Filed: Oct. 1, 2020

(65) Prior Publication Data
US 2021/0021239 A1    Jan. 21, 2021

Related U.S. Application Data

(63) Continuation of application No. PCT/CN2020/092347, filed on May 26, 2020.

(30) Foreign Application Priority Data

May 27, 2019  (CN) .......................... 201910448539.6

(51) Int. Cl.
*H03F 1/32* (2006.01)
*H03F 1/02* (2006.01)
*H03F 3/21* (2006.01)

(52) U.S. Cl.
CPC ............. *H03F 1/32* (2013.01); *H03F 1/0216* (2013.01); *H03F 3/21* (2013.01); *H03F 2200/105* (2013.01); *H03F 2200/451* (2013.01)

(58) Field of Classification Search
CPC . H03F 1/32; H03F 1/0216; H03F 3/21; H03F 2200/105; H03F 2200/451
USPC ....................................................... 330/297
See application file for complete search history.

(56) References Cited

U.S. PATENT DOCUMENTS

2020/0266766 A1 * 8/2020 Khlat .................... H03F 1/0238

FOREIGN PATENT DOCUMENTS

CN           108768307 A  * 11/2018  ............... H03F 1/02

* cited by examiner

*Primary Examiner* — Hafizur Rahman
(74) *Attorney, Agent, or Firm* — W&K IP

(57) ABSTRACT

A power supply for a radio-frequency power amplifier includes: first and second linear circuits, configured to linearly amplify a low-power signal and a high-power signal in a first envelope signal respectively and provide first and second voltages to the radio-frequency power amplifier respectively, wherein the low-power signal is a signal with a power ratio less than or equal to 30% in the envelope signal, and the high-power signal other than the low-power signal is a signal with a power ratio greater than or equal to 70% in the envelope signal; and a third circuit, configured to detect the linearly-amplified high-power signal and work in a constant on time control mode having a constant on time or a constant off time control mode having a constant off time so as to provide a third electric current to the radio-frequency power amplifier according to the detected linearly-amplified high-power signal.

10 Claims, 6 Drawing Sheets

POWER SUPPLY FOR RADIO-FREQUENCY POWER AMPLIFIER

CROSS REFERENCE TO RELATED APPLICATIONS

This application is a continuation of International Patent Application No. PCT/CN2020/092347 with a filing date of May 26, 2020, designating the United States, now pending, and further claims priority to Chinese Patent Application No. 201910448539.6 filed on May 27, 2019, the entire content of which is incorporated herein by reference.

TECHNICAL FIELD

The present invention relates to the field of mobile communication, and in particular to a power supply for a radio-frequency power amplifier.

BACKGROUND

In the field of mobile communication, a hybrid power supply in which a linear amplification unit is combined with a switching power supply may be used to improve the efficiency of a radio-frequency power amplifier. Such hybrid power supplies usually adopt hysteresis control technology. Although the technology enables a system to work stably by effectively combining linear amplification technology with switching power supply technology, switching-frequency in the technology is affected by an envelope signal bandwidth: along with increase of the envelope signal bandwidth, the switching frequency will be accelerated, thereby imposing challenge to the on/off control. In addition, an on-time point of the technology is highly sensitive to an output noise, and the on-time often lags behind an optimal on/off time point. Further, when the envelope signal with a wide bandwidth and a high peak-to-average power ratio (PAPR) is processed based on the technology, output power losses of the switching power supply and a linear-amplification-related circuit will be increased simultaneously, thereby resulting in that the efficiency of an entire power system is reduced along with the increase of the bandwidth.

In a case of the continuously increasing bandwidth, how to further improve the power supply efficiency of the radio-frequency power amplifier always remains a technical problem to be considered in this field.

SUMMARY

To solve the above technical problem, the present invention provides a power supply for a radio-frequency power amplifier, including:

a first linear circuit, configured to linearly amplify a low-power signal in a first envelope signal and provide a first voltage to the radio-frequency power amplifier according to the linearly-amplified low-power signal, where the low-power signal is a signal with a power ratio less than or equal to 30% in the envelope signal;

a second linear circuit, configured to linearly amplify a high-power signal other than the low-power signal in the first envelope signal and provide a second voltage to the radio-frequency power amplifier according to the linearly-amplified high-power signal, where the high-power signal other than the low-power signal is a signal with a power ratio greater than or equal to 70% in the envelope signal; and a third circuit, configured to detect the linearly-amplified high-power signal and work in a constant on time control mode having a constant on time or a constant off time control mode having a constant off time so as to provide a third electric current to the radio-frequency power amplifier according to the detected linearly-amplified high-power signal.

Preferably, the first envelope signal is an envelope signal input into the radio-frequency power amplifier.

Preferably, the lower-power signal and/or the high-power signal other than the low-power signal in the first envelope signal are/is obtained by any one or any combination of: a filter, an RF detector and an RMS detector.

Preferably, the power supply further includes a first mode selecting unit configured to perform selection between the constant on time control mode and the constant off time control mode.

Preferably, the third circuit includes a third controlling unit, a third driving unit and a third inductor.

The third controlling unit includes an input end configured to receive the detected linearly-amplified high-power signal.

The third controlling unit further includes an output end configured to output a third control signal to enable the power supply to work in any one of the following modes: the constant on time control mode having the constant on time and the constant off time control mode having the constant off time.

The third driving unit is configured to connect the output end of the third controlling unit and provide a third electrical signal to the third inductor based on the third control signal.

The third inductor is configured to provide the third electric current to the radio-frequency power amplifier under the action of the third electrical signal.

Preferably, the third driving unit includes a third switching amplifier or includes an upper power transistor and a lower power transistor.

Preferably, the third circuit includes a timing unit configured to determine the constant on time or the constant off time.

Preferably, the third circuit includes a comparator configured to:

(1) when a preset electric current value ID in the third circuit is less than or equal to an output electric current ripple value ISL of the second linear circuit, enable the third circuit to work and provide the third electric current; and (2) when the preset electric current value ID in the third circuit is greater than or equal to the output electric current ripple value ISL of the second linear circuit, disable the third circuit to provide the third electric current.

Preferably, the second linear circuit includes a plurality of branches connected in parallel.

Each branch linearly amplifies part of the high-power signals and provides a corresponding branch voltage according to the linearly-amplified part of the high-power signals.

Different branch voltages are superimposed to be supplied as the second voltage to the radio-frequency power amplifier.

Preferably, the first linear circuit includes a first inductor, and the first linear circuit provides the first voltage to the radio-frequency power amplifier by using the third inductor, in the third circuit, having mutual inductance with the first inductor.

Compared with the traditional hysteresis control, the present invention realizes, through the above technical solution, a new power supply for a radio-frequency power amplifier capable of adaptively providing electric energy to the radio-frequency power amplifier according to different power ratios in the envelope signal so as to improve the entire power supply efficiency.

DETAILED DESCRIPTION OF THE EMBODIMENTS

In the following descriptions, a plurality of details are set forth to provide a more complete explanation to the embodiments of the present invention. However, it is apparent that those skilled in the art may implement the embodiments of the present invention without these specific details. In other embodiments, well-known structures and devices are illustrated in the form of block diagram rather than in details to avoid obscuring the embodiments of the present invention. In addition, features of different embodiments described below may be combined with each other, unless otherwise specifically stated.

Terms such as "first" and "second" used herein are intended to distinguish different objects rather than describe a specific order. In addition, terms "including" and "having" and any variation thereof are intended to encompass non-exclusive inclusion. For example, a process, method, system, product or device including a series of steps or units is not limited to listed steps or units, but optionally further includes unlisted steps or units, or optionally further includes other steps or units inherent to such a process, method, system, product or device.

The "embodiment" mentioned herein means that specific features, structures, or characteristics described in combination with the embodiments may be included in at least one embodiment of the present invention. The described embodiments are part of embodiments of the present invention rather than all embodiments. The phrases appearing at different positions in the specification neither necessarily all refer to the same embodiment nor refer to independent or optional embodiments mutually repulsive to other embodiments. Those skilled in the art may understand that the embodiments described herein may be combined with other embodiments.

Figure 1:
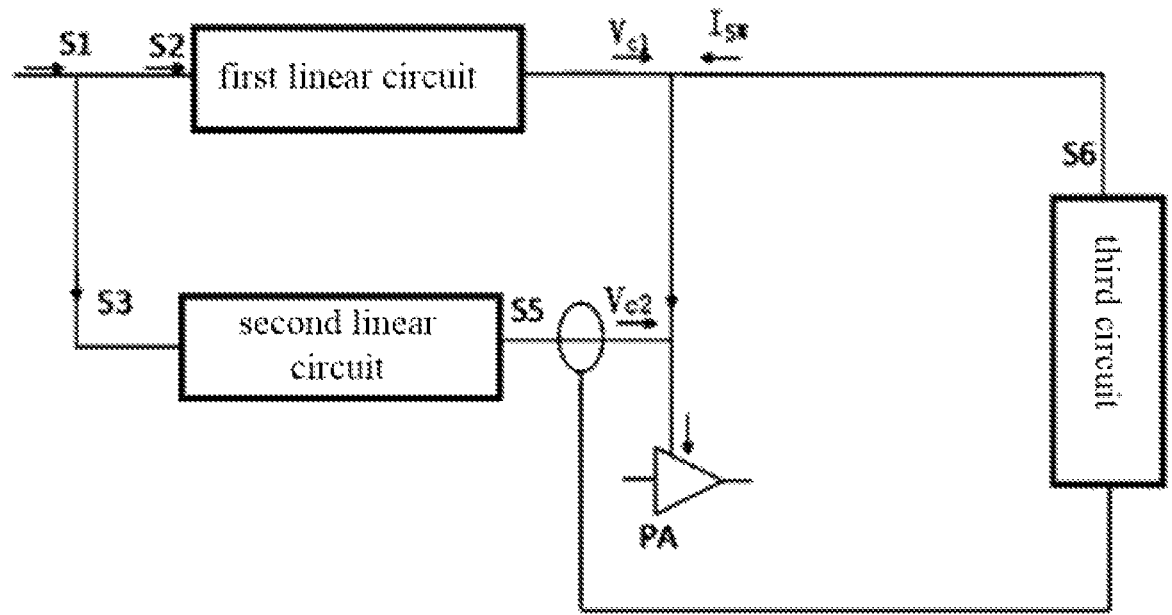
FIG. 1 is structural schematic diagram of power supplies according to different embodiments of the present invention.

As shown in FIG. 1, in an embodiment, the present invention provides a power supply for a radio-frequency power amplifier (PA), including:

a first linear circuit, configured to linearly amplify a low-power signal S2 in a first envelope signal S1 and provide a first voltage Vc1 to the radio-frequency power amplifier (PA) according to the linearly-amplified low-power signal, where the low-power signal S2 is a signal with a power ratio less than or equal to 30% in the envelope signal;

a second linear circuit, configured to linearly amplify a high-power signal S3 other than the low-power signal S2 in the first envelope signal S1 and provide a second voltage Vc2 to the radio-frequency power amplifier (PA) according to the linearly-amplified high-power signal, where the high-power signal S3 other than the low-power signal is a signal with a power ratio greater than or equal to 70% in the envelope signal; and a third circuit, configured to detect the linearly-amplified high-power signal and work in a constant on time control mode having a constant on time or a constant off time control mode having a constant off time so as to provide a third electric current ISW to the radio-frequency power amplifier (PA) according to the detected linearly-amplified high-power signal.

In the above embodiment, on one hand, the first and second linear circuits linearly amplify the low-power signal and the high-power signal respectively and provide the first voltage Vc1 and the second voltage Vc2 to the radio-frequency power amplifier (PA);

on the other hand, according to a feature that the power ratio of the high-power signal is high in the envelope signal, the third circuit provides the third electric current ISW to the radio-frequency power amplifier (PA) in a COT control mode (the constant on time control mode or the constant off time control mode).

In this case, the above embodiment achieves the following effects.

Firstly, the high-power and lower-power envelop signals are classified by two linear circuits without designing a traditional signal modulation processing unit for the high-power and lower-power envelope signals, thereby reducing complexity of the power supply.

Secondly, classifying the high-power and lower-power envelope signals by two linear circuits not only increases a peak-to-average power ratio (PAPR) of the entire envelope signals, but also reduces a PAPR of input signals in two linear circuits, thereby reducing swings of output voltages in the first and second linear circuits; correspondingly, the power losses of the first and second linear circuits are reduced and the efficiency of the power supply is improved.

Thirdly, the first and second linear circuits provide the first voltage Vc1 and the second voltage Vc2 to the radio-frequency power amplifier (PA), which means that the first and second linear circuits can serve as voltage sources in the above embodiment. In this case, when the first and second linear circuits do not involve provision of the electric current, the power losses of the first and second linear circuits are reduced, and the efficiency of the power supply is improved. Further, a bandwidth processing capability of the power supply is improved under the equivalent condition.

Fourthly, in addition to the characteristics brought by the first and second linear circuits, the third circuit provides the third electric current to the radio-frequency power amplifier under double actions of the high-power signal and the COT control (the constant on time control mode or the constant off time control mode); on one hand, the third circuit can be switched on and off free from influence of the bandwidth of the envelope signal, helping the switching frequency of the power supply. Thus, the power loss of the switching process and an impact of noise on the system both are reduced, the stability of the system is enhanced, and the characteristic of jitter frequency resistance EMI in a traditional hysteresis control circuit is maintained with a jitter frequency range being limited. In this way, the efficiency of the power supply is improved without affecting linearity of the system; on the other hand, since the power ratio of the high-power signals is more than 70% in the entire envelope signals, the third electric current is more approximate to an average electric current value, so that the power output by the power supply is more approximate to an RMS signal in the envelope signals, thereby realizing a new meaningful envelope tracking power supply in engineering.

In other words, compared with the prior art, the power supply in the above embodiment not only processes the low-power signal and the high-power signal respectively, but also fully utilizes the advantages of the linear amplification and the COT control, so that the power supply efficiency and stability are improved and the overall efficiency of the power supply is not affected due to bandwidth expansion.

It can be understood that more preferably, the high-power signals have a power ratio of 80-90% in the envelope signals so that a balance between the switching frequency of the power supply and the efficiency of the power supply can be achieved better. Correspondingly, this means that the ratio of the low-power signals is 10-20%.

Matching of a time constant or time delay of each circuit itself belongs to common knowledge of the circuit field. The present invention also does not focus on how to design and adjust the time constant, and thus will not make the descriptions redundantly. It can be understood that the power supply of the above embodiment may be an analog power supply or a digital power supply as long as the above power supply can be realized by an analog circuit or a digital circuit.

In addition, when the radio-frequency power amplifier is determined to be at light load or no load, the constant on time mode is preferable in the above embodiment. The reason is that compared with increase of a switching loss and reduction of the efficiency of the power supply resulting from the constant off-time mode at the light load, the constant on time mode is more conducive to reducing the switching loss and improving the efficiency of the power supply at the light load or no load.

Figure 2:
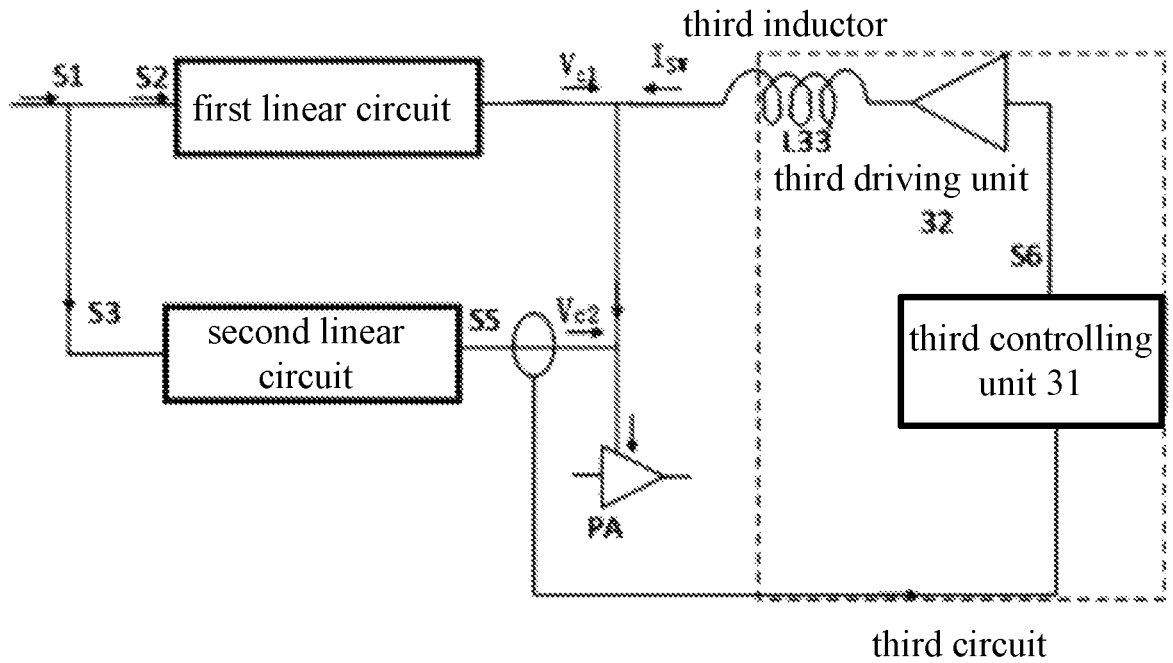
FIG. 2 is structural schematic diagram of power supplies according to different embodiments of the present invention.

As shown in FIG. 2, in another embodiment, the third circuit includes a third controlling unit 31, a third driving unit 32 and a third inductor L33.

The third controlling unit 31 includes an input end configured to receive the detected linearly-amplified high-power signal.

The third controlling unit 31 further includes an output end configured to output a third control signal to enable the power supply to work in any one of the following modes: the constant on time control mode having the constant on time and the constant off time control mode having the constant off time.

The third driving unit 32 is configured to connect the output end of the third controlling unit and provide the third electrical signal to the third inductor L33 based on the third control signal.

The third inductor is configured to provide the third electric current ISW to the radio-frequency power amplifier under the action of the third electrical signal.

In the above embodiment, the third controlling unit 31 may be any COT controlling unit capable of realizing COT control. The COT includes a Constant On Time and a Constant Off Time. It is to be noted that the present invention does not focus innovative realization of the COT controlling unit. Therefore, different COT controlling units in the prior art all may be employed, including a timer or a time counter possibly involved in the COT control, or another circuit or functional unit cooperating with the timer or the time counter with its main purpose of calculating and determining a corresponding constant on time or constant off time.

It can be understood that an obvious difference from the power supply performing hysteresis control after filtering in the prior art is that third circuit itself performs fast response and adjustment for the on-time or off-time of the third driving unit through the third controlling unit rather than the filtering unit and the hysteresis control, so as to improve the efficiency. That is, compared with the prior art in which the filtering and the after-filtering hysteresis control are adopted, the above embodiment adopts the COT control, so that the frequency of the third driving unit is not subjected to limitations such as an equivalent load, hysteresis, a loop delay and an input signal. Therefore, the above embodiment not only has a simple solution with a high efficiency, but also can eliminate the jitter of the control signal and reduce the noise. Further, due to a high response speed, the COT control is very applicable to an application scenario such as envelope tracking requiring a large input signal bandwidth and ease of expansion.

It is specially pointed out that when the power supply is enabled to work in the constant on time mode or the constant off time mode by the third driving unit 32, the third driving unit 32 enables the power supply to have the characteristics of the switching power supply. Further, since the power supply includes first and second linear units, the power supply is a hybrid envelope tracking power supply combining two characteristics of the linear amplification and the switching power supply. However, with rapid development of wireless communication technology, a 5G commercialization era will come up, and 6G technology is already in the research stage. In the face of sharp increase of different service data such as mobile Internet and internet of things, a peak-to-average power ratio (PAPR) of the radio-frequency input signals becomes larger and larger, resulting in a very low efficiency of the linear amplification technology of the constant-voltage power supply in a case of a large PAPR.

Obviously, the above embodiment is helpful to solving the problem of the reduced efficiency of the entire power supply resulting from the very low efficiency of the linear amplification technology in the case of the large PAPR. In the above embodiment, in addition to the first and second linear units, the power supply is enabled to work in the constant on time mode or the constant off time mode by the third driving unit based on the detected high-power signals, which helps to increase the ratio of the switching power supply in the entire power supply and reduce the power loss ratio of the linear circuit according to the high-power signals with the high ratio. Thus, the advantage of high efficiency of the switching power supply is brought to full play. Therefore, the above embodiment is helpful to further improving the efficiency of the entire power supply.

In another embodiment, the first envelope signal is an envelope signal input into the radio-frequency power amplifier.

In this embodiment, when the first envelope signal is the envelope signal input into the radio-frequency power amplifier, as a radio-frequency (RF) input signal is taken as a reference signal of envelope tracking in most technical solutions in the prior art, envelope tracking is also realized from a signal source, i.e., the envelop signal input into the radio-frequency power amplifier in this embodiment. However, this does not mean that the present invention excludes other first envelope signals. It is apparent that the relevant embodiments are not limited to the source of the envelope signals in terms of achieving technical effects of different embodiments described above according to principles disclosed by the present invention.

In another embodiment, the power supply further includes a first mode selecting unit configured to perform selection between the constant on time control mode and the constant off time control mode.

This embodiment provides an implementation of mode selection, that is, selection is performed by the first mode selecting unit. It can be understood that the selection may be implemented by a hardware circuit or through software calculation. In addition, as described above, when the radio-frequency power amplifier is determined to be at light load or no load, the constant on time control mode may also be further preferred regardless of the hardware circuit or the software calculation.

As described above, in another embodiment, the third circuit includes a timing unit configured to determine the constant on time or the constant off time.

It is to be noted that all corresponding approaches in the prior art may be adopted to determine the constant on time or the constant off time, which will not be described in detail in the present invention. The timing unit may be disposed in the third controlling unit or used as an independent unit of the third circuit.

In another embodiment, the lower-power signal and/or the high-power signal other than the low-power signal in the first envelope signal may be obtained by any one or any combination of: a filter, an RF detector and an RMS detector.

A purpose of this embodiment is to detect the low-power signal and/or the high-power signal for classification of the low-power signal and the high-power signal. It can be understood that for the first and second linear circuits, the low-power signal and the high-power signal may be detected respectively by selecting different types of filters and/or RF detectors (also referred to as RF power detectors, for example, corresponding products of Analog Device, Inc. (ADI)) and/or RMS detectors (also referred to as RMS response power detectors) according to frequency and power characteristics of the low-power signal and the high-power signal. It is to be noted that to balance the switching frequency of the power supply and the efficiency of the power supply, definitions of the low-power signal and the high-power signal may also be adjusted by the filter, the RF detector and the RMS detector, that is, the power ratios in the definitions are increased or decreased.

In another embodiment, more preferably, since the envelope signal includes the lower-power signals and the high-power signals, only the lower-power signals/the high-power signals may be detected, and then the remaining high-power signal/low-power signals may be obtained by performing a subtraction operation for the detected low-power signals/the detected high-power signals through the envelope signals.

Figure 3:
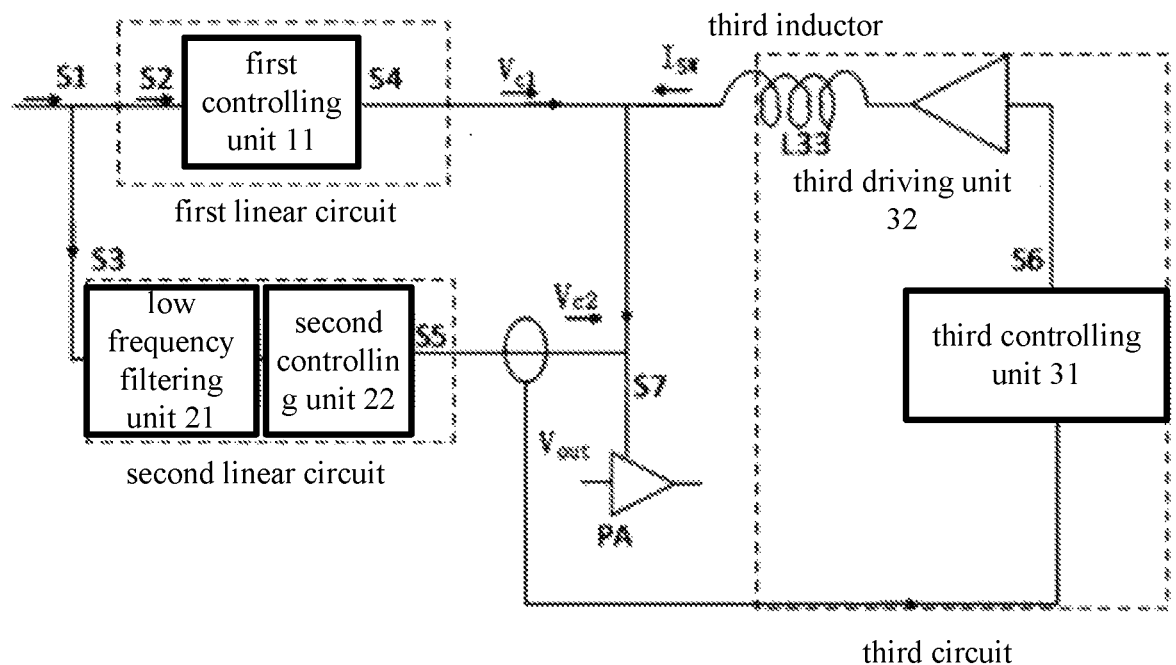
FIG. 3 is structural schematic diagram of power supplies according to different embodiments of the present invention.

In another embodiment, as shown in FIG. 3, if only low-frequency filtering unit (i.e., a low-frequency filter in the filters) is adopted in the second linear circuit, the following operations will be performed:

on one hand, the low-frequency filtering unit may filter out unnecessary high-frequency signals (note: correspond to low-power signals) in S1 to enable low-frequency signals S3 (i.e., high-power signals S3) with high power ratio to pass, complete linear amplification for the low-frequency signals in the second controlling unit and provide the second voltage to the radio-frequency power amplifier;

on the other hand, since the first linear circuit and the second linear circuit are connected in parallel in FIG. 3, the remaining signals, i.e., the low-power signals S2 other than the high-power signals S3 enter the first linear circuit. In this case, without the filter, the first linear circuit linearly amplifies the low-power signals S2 through the first controlling unit and provides the first voltage to the radio-frequency power amplifier.

In other words, in this embodiment, the first and second linear circuits may process the high-power signals and the low-power signals respectively by only disposing the low-frequency filtering unit in the second linear circuit. It can be understood that the first and second controlling units may include a linear amplifier when realizing linear amplification.

Figure 4:
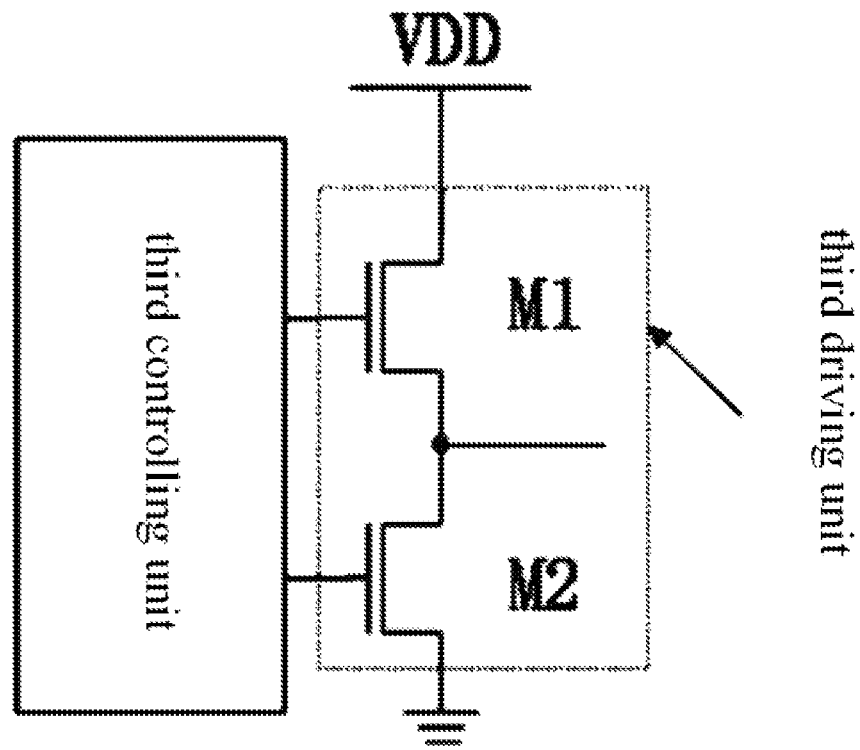
FIG. 4 is a schematic diagram illustrating a third circuit according to an embodiment of the present invention.

As shown in FIG. 4, in another embodiment, the third driving unit includes a third switching amplifier or includes an upper power transistor and a lower power transistor.

It is obvious that the switching amplifier is configured to be implemented as the driving unit of the switching power supply.

In this embodiment, as shown in FIG. 4, for example, the third driving unit includes an upper power transistor M1 and a lower power transistor M2.

As shown in FIG. 4, the third driving unit includes the upper power transistor M1 and the lower power transistor M2, where one end of M1 is connected to a VDD power supply, one end of M2 is grounded, a common end of M1 and M2 is an output end, and gate electrodes of M1 and M2 are connected with an output end of the controlling unit respectively so that on or off is realized based on a gate voltage provided by the third controlling unit.

In another embodiment, the third circuit includes a comparator configured to:

(1) when a preset electric current value ID in the third circuit is less than or equal to an output electric current ripple value ISL of the second linear circuit, enable the third circuit to work and provide the third electric current ISW; and (2) when the preset electric current value ID in the third circuit is greater than or equal to the output electric current ripple value ISL of the second linear circuit, disable the third circuit to provide the third electric current.

In this embodiment, although the second linear circuit may be considered as a voltage source, it is unavoidable to output the electric current ripple value in a practical engineering application. To achieve the high efficiency of the power supply, the third circuit is controlled to work by using the output electric current ripple value ISL of the second linear circuit. It can be understood that the comparator may be an independent unit in the third circuit, or may also become part of the third controlling unit in combination with the previous embodiment. Further, the output electric current ripple value may provide the electric current to the radio-frequency power amplifier together with the third electric current, which will be detailed below.

Figure 5:
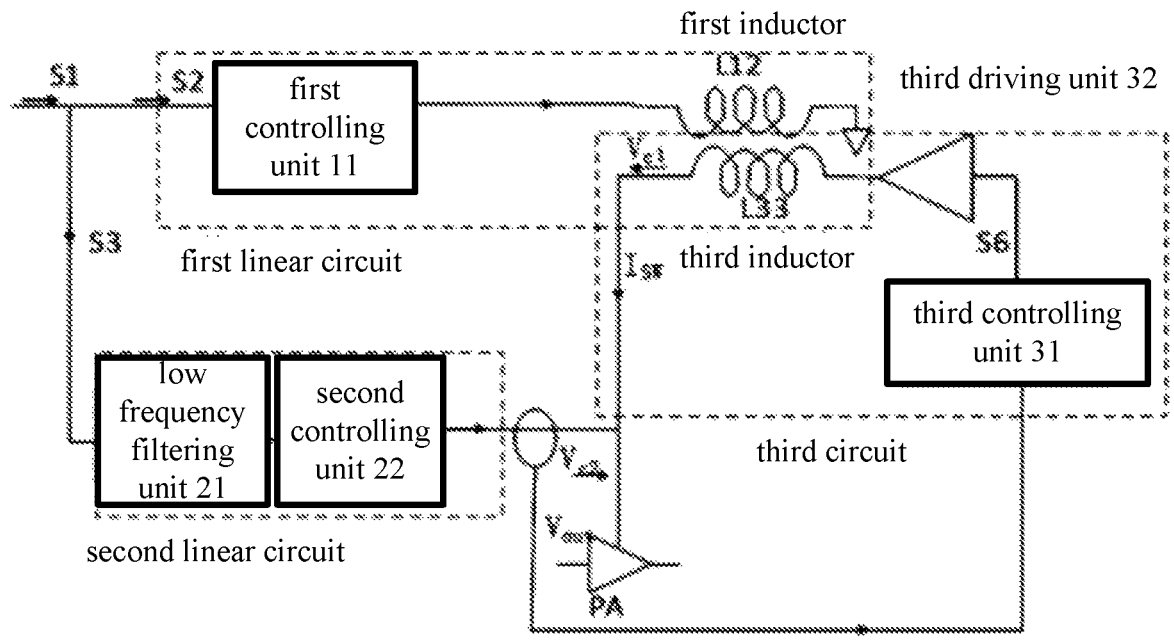
FIG. 5 is structural schematic diagram of power supplies according to different embodiments of the present invention.

As shown in FIG. 5, in another embodiment, the first linear circuit includes a first inductor L12, and the first linear circuit provides the first voltage Vc1 to the radio-frequency power amplifier by using the third inductor, in the third circuit, having mutual inductance with the first inductor L12.

Figure 6:
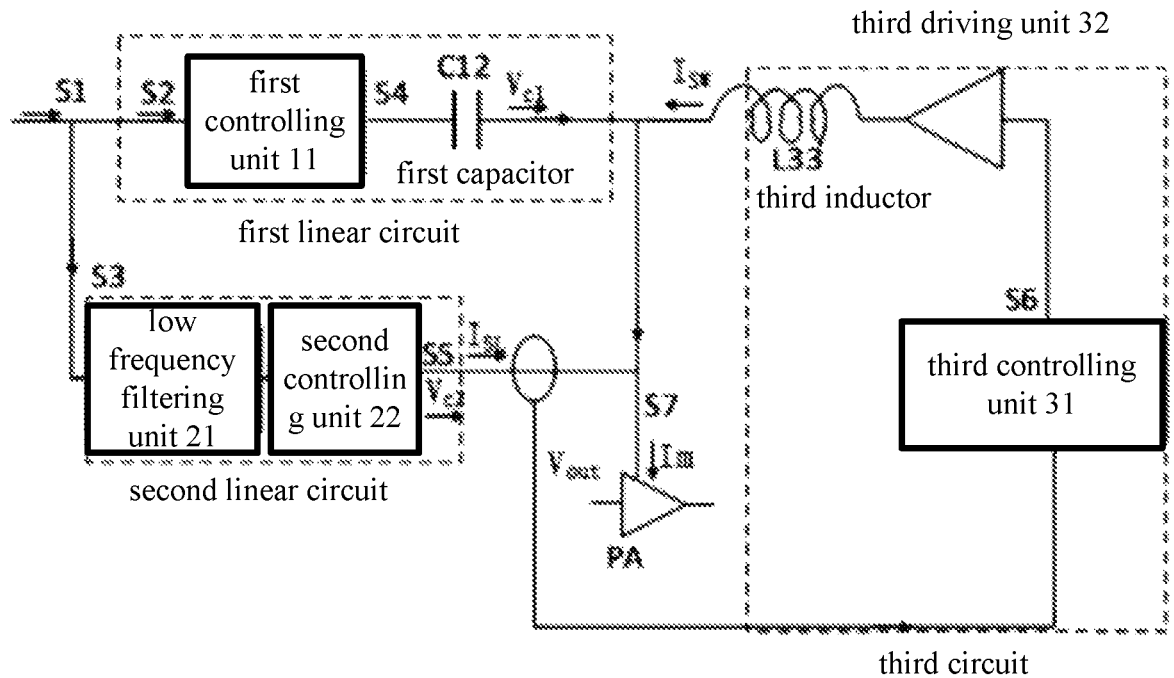
FIG. 6 is structural schematic diagram of power supplies according to different embodiments of the present invention.
Figure 7:
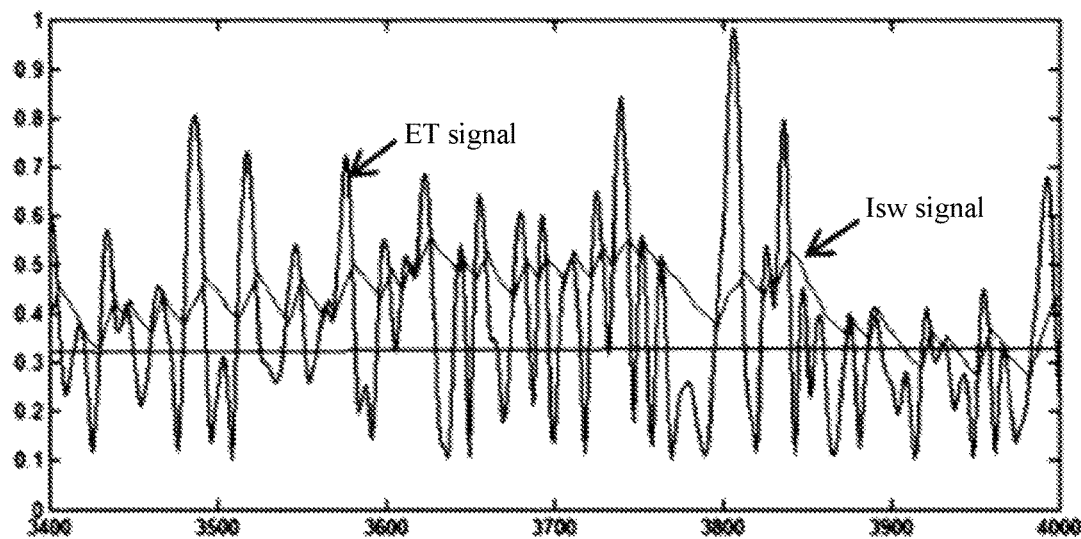
FIG. 7 is a simulation diagram of a traditional hysteresis control power supply with a first envelope signal being a signal of 100 MHz when small inductance of 1 uH is adopted.
Figure 8:
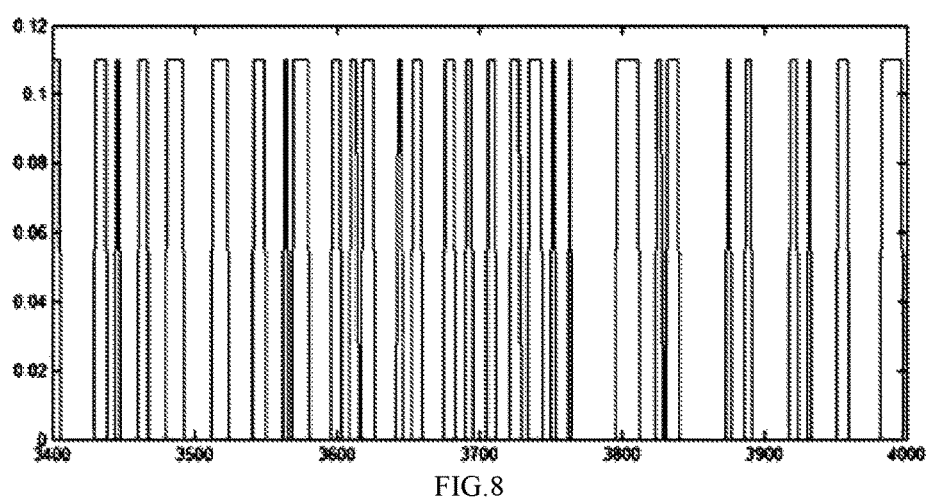
FIG. 8 is a switching waveform of a driving unit corresponding to a switching power supply of the traditional hysteresis control power supply.
Figure 9:
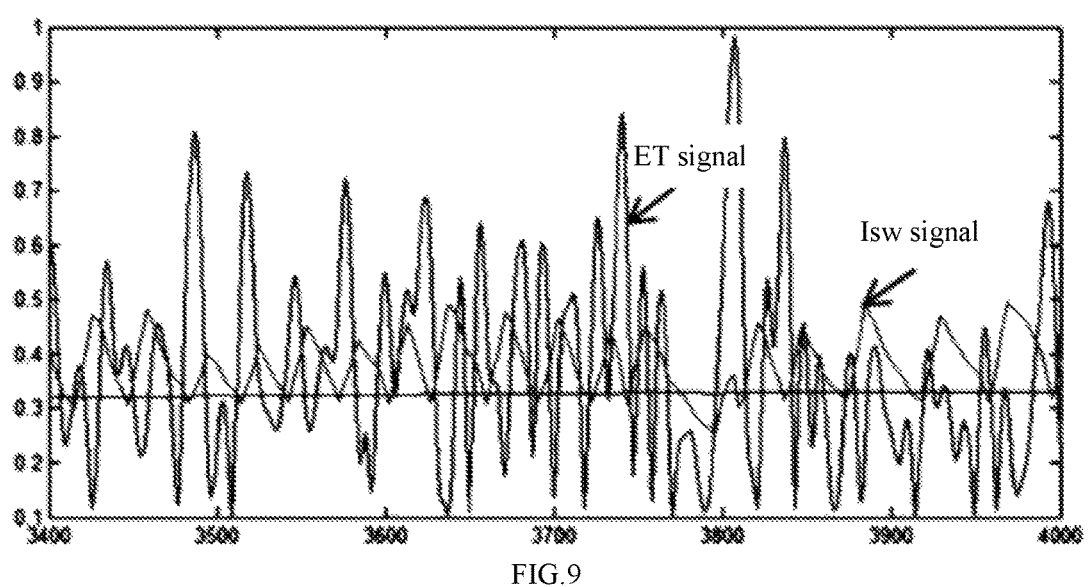
FIG. 9 is a simulation diagram of a power supply with the same first envelope signal being the signal of 100 MHz when the small inductance of 1 uH is adopted according to an embodiment of the present invention.
Figure 10:
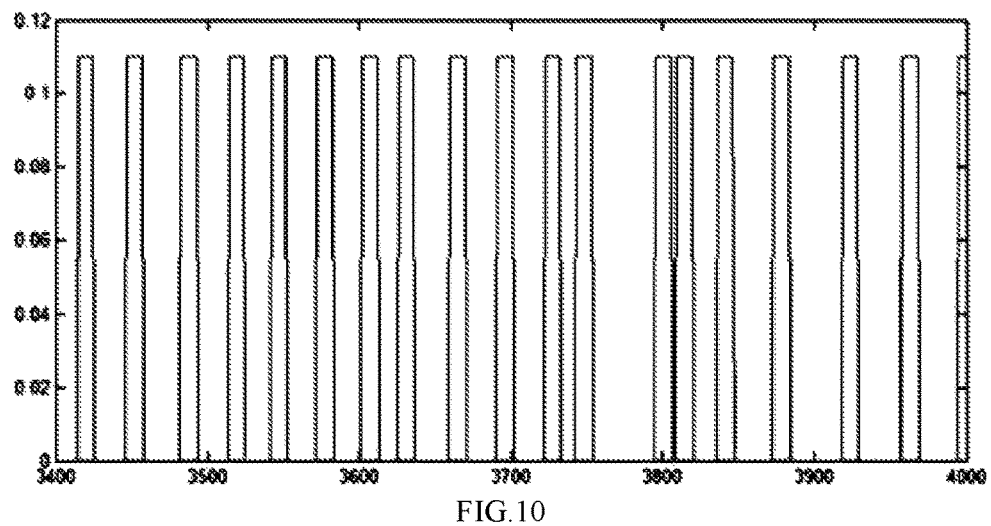
FIG. 10 is a switching waveform of a third driving unit corresponding to a switching power supply of the power supply according to the embodiment of the present invention.
Figure 11:
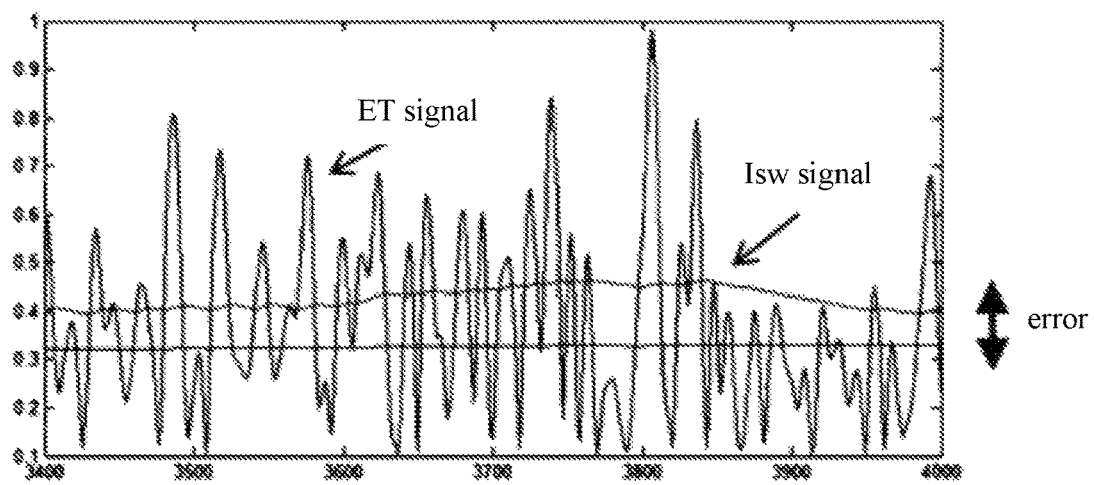
FIG. 11 is a simulation diagram of a traditional hysteresis control power supply with a first envelope signal being a signal of 100 MHz when large inductance of 50 uH is adopted.
Figure 12:
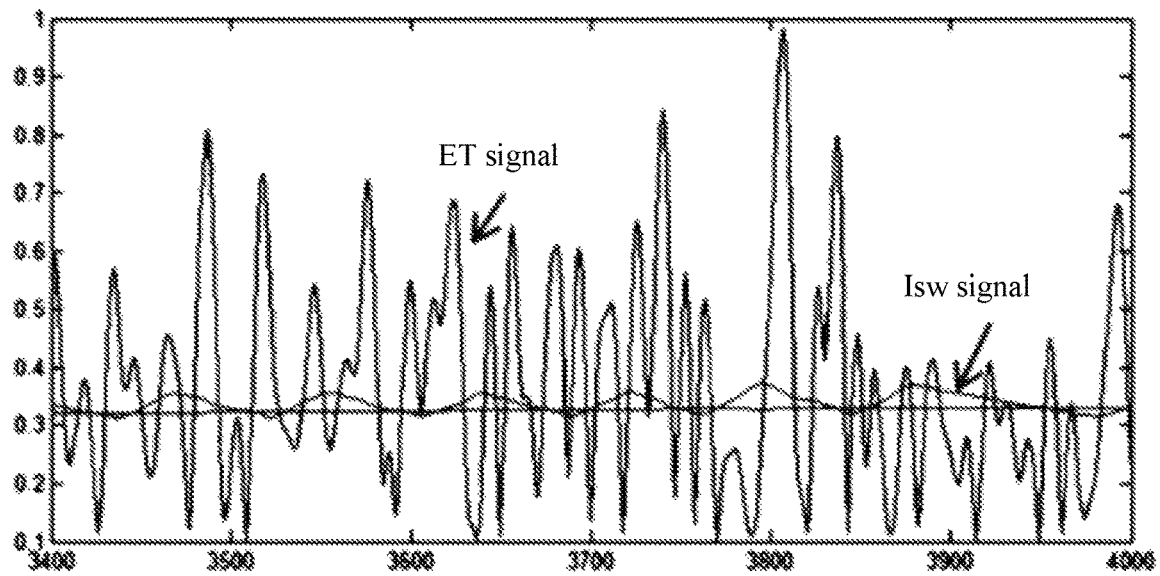
FIG. 12 is a switching waveform of a driving unit corresponding to a switching power supply of the traditional hysteresis control power supply.
Figure 13:
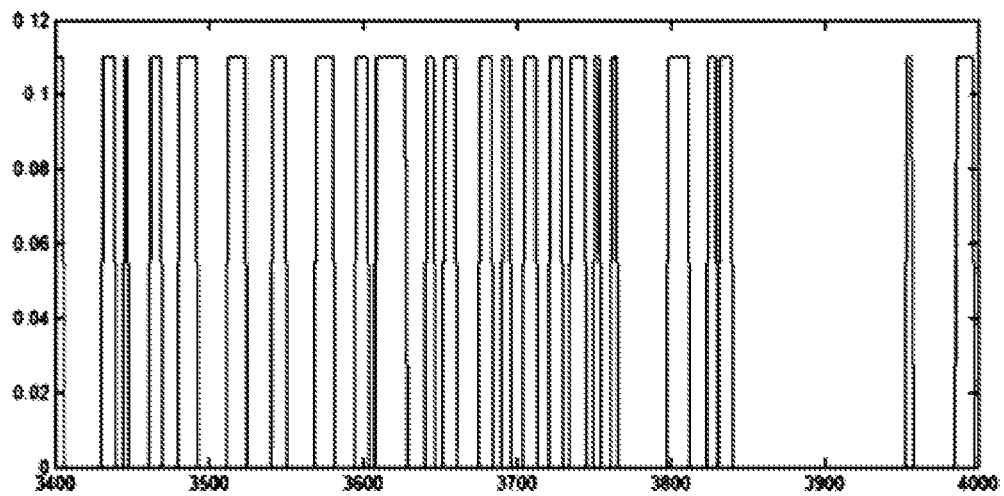
FIG. 13 is a simulation diagram of a power supply with the same first envelope signal being the signal of 100 MHz when the large inductance of 50 uH is adopted according to an embodiment of the present invention.
Figure 14:
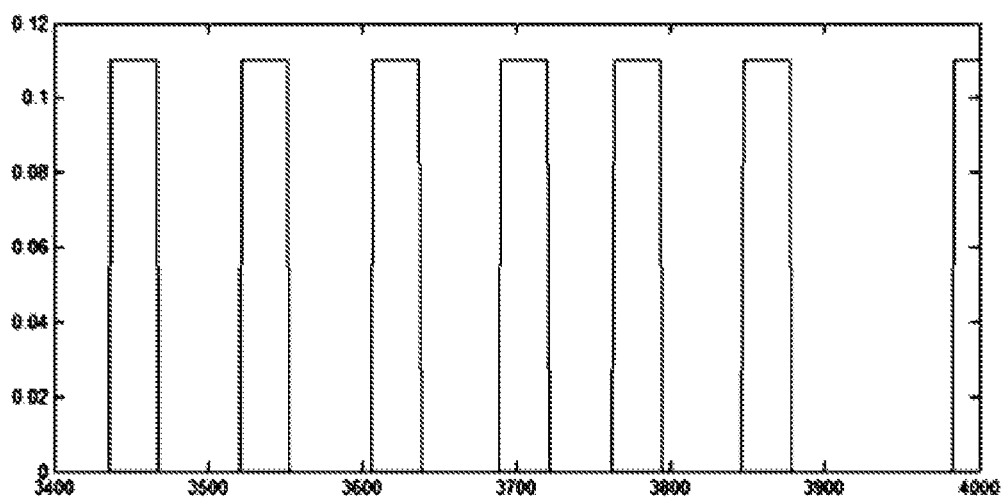
FIG. 14 is a switching waveform of a third driving unit corresponding to a switching power supply of the power supply according to the embodiment of the present invention.

As shown in FIG. 6, in another embodiment, the first linear circuit includes a first capacitor C12 and provides the first voltage Vc1 to the radio-frequency power amplifier by using the first capacitor C12.

In combination with other previous embodiments, when the output electric current ripple value ISL of the second linear circuit enables the third circuit to work, the output electric current ripple value ISL may provide an electric current Im to the radio-frequency power amplifier together with the third electric current ISW.

In another embodiment, the second linear circuit includes a plurality of branches connected in parallel.

Each branch linearly amplifies part of the high-power signals, and provides a corresponding branch voltage according to the linearly-amplified part of the high-power signals.

Different branch voltages are superimposed to be provided as the second voltage to the radio-frequency power amplifier.

It can be understood that since the envelope signals includes signals with different frequencies and corresponding power ratios, the high-power signals of the envelope signals may be detected by adopting a plurality of branches connected in parallel according to the frequency and/or the power, as the lower-power signals and the high-power signals are detected respectively above. Such parallel connection solution is used to provide the second voltage to the radio-frequency power amplifier more efficiently. Of course, the solution will increase costs and complexity of the relevant circuits. Those skilled in the art may balance the complexity of the circuit and the efficiency of the power supply according to actual situations.

Similarly, the first linear circuit may further include a plurality of branches connected in parallel.

Each branch linearly amplifies part of the low-power signals, and provides a corresponding branch voltage according to the linearly-amplified part of the low-power signals.

Different branch voltages are superimposed to be provided as the first voltage to the radio-frequency power amplifier.

Further, when the second linear circuit includes a plurality of branches connected in parallel, the third circuit may also detect the high-power signals linearly-amplified by each branch in the second linear circuit respectively through each branch of the third circuit in one-to-one correspondence to each branch of the second linear circuit, and even may further enable each branch of the third circuit to work in the COT mode according to an electric current value preset for each branch of the third circuit and the output electric current ripple value of each branch in the second linear circuit, so as to superimpose the electric currents output by different branches of the third circuit and provide the third electric current to the radio-frequency power amplifier.

FIGS. 7-14 are simulation effect diagrams of a traditional hysteresis control circuit and a COT control mode circuit used in a third controlling unit 31 of the present invention after modulation is performed for a same envelope signal and same inductance, in which the modulation for a 100 MHz signal is illustrated. In the present invention, the switching frequency of the COT control mode is lower, and the electric current is more approximate to the envelope signal, thereby optimizing the optimal on-time point of COT. As shown in FIGS. 7-10, when the traditional hysteresis control circuit and the COT control mode circuit of the present invention both adopt small inductance of 1 uH, due to the small inductance value, the output electric current ripple of the second controlling unit 22 is large, a system delay is small, and a response speed for envelope tracking is increased; in comparison, as shown in FIGS. 11-14, when the traditional hysteresis control circuit and the COT control mode circuit of the present invention both adopt large inductance of 50 uH, due to the relatively large inductance value, the output electric current ripple of the second controlling unit 22 is reduced, the system delay is large, the response speed for envelope tracking is decreased, but the electric current is more approximate to the average value. Therefore, the power output by the system is more approximate to the RMS signals in the envelope signal, the overall power loss consumed by the linear circuits is reduced, the switching frequency of the COT control mode is further reduced, and the system efficiency is improved.

In addition, in some embodiments, the controlling unit may be provided on a chip or processor (e.g., silicon) of a digital transmitter. Furthermore, the driving unit may also be provided on the chip or processor of the digital transmitter. Further, the remaining units may also be provided on the relevant chips or processors. The above power supply may also be provided on the chip or processor of the digital transmitter naturally.

The embodiments of the present invention may be implemented by hardware or software according to specific implementation requirements. The implementation may be executed by using a digital storage medium (such as a floppy disk, a Digital Video Disk (DVD), Blu-ray, a compact disk (CD), a Read-Only Memory (ROM), a Programmable Read-Only Memory (PROM), an Erasable Programmable Read-Only Memory (EPROM), an Electrically Erasable Programmable Read-Only Memory (EEPROM) or a flash memory) storing electronically readable control signals. Therefore, the digital storage medium may be computer readable.

In some embodiments, some or all functions of the method described herein may be executed by using a programmable logic device (e.g., a field programmable gate array). In some embodiments, the field programmable gate array may cooperate with a microprocessor to implement the power supply described herein.

The above embodiments are merely illustrative of principles of the present invention. It is to be understood that modifications and variations of arrangements and details described herein are apparent to those skilled in the art. Therefore, intentions are limited only by the scope of the following patent claims rather than specific details presented through the descriptions and explanations of the embodiments herein.

The invention claimed is:

1. A power supply for a radio-frequency power amplifier, comprising: a first linear circuit, configured to linearly amplify a low-power signal in a first envelope signal and provide a first voltage to the radio-frequency power amplifier according to the linearly-amplified low-power signal, wherein the low-power signal is a signal with a power ratio less than or equal to 30% in the envelope signal; a second linear unit, configured to linearly amplify a high-power signal other than the low-power signal in the first envelope signal and provide a second voltage to the radio-frequency power amplifier according to the linearly-amplified high-power signal, wherein the high-power signal other than the low-power signal is a signal with a power ratio greater than or equal to 70% in the envelope signal; and a third circuit, configured to detect the linearly-amplified high-power signal and work in a constant on time control mode having a constant on time or a constant off time control mode having a constant off time so as to provide a third electric current to the radio-frequency power amplifier according to the detected linearly-amplified high-power signal.

2. The power supply according to claim 1, wherein the first envelope signal preferably is an envelope signal input into the radio-frequency power amplifier.

3. The power supply according to claim 1, wherein the lower-power signal and/or the high-power signal other than the low-power signal in the first envelope signal are/is obtained by any one or any combination of: a filter, an RF detector and an RMS detector.

4. The power supply according to claim 1, further comprising a first mode selecting unit configured to perform selection between the constant on time control mode and the constant off time control mode.

5. The power supply according to claim 1, wherein the third circuit comprises a third controlling unit, a third driving unit and a third inductor; the third controlling unit comprises an input end configured to receive the detected linearly-amplified high-power signal; the third controlling unit further comprises an output end configured to output a third control signal to enable the power supply to work in any one of the following modes: the constant on time control mode having the constant on time and the constant off time control mode having the constant off time; the third driving unit is configured to connect the output end of the third controlling unit and provide a third electrical signal to the third inductor based on the third control signal; the third inductor is configured to provide the third electric current to the radio-frequency power amplifier under the action of the third electrical signal.

6. The power supply according to claim 1, wherein the third driving unit comprises a third switching amplifier or comprises an upper power transistor and a lower power transistor.

7. The power supply according to claim 1, wherein the third circuit comprises a timing unit configured to determine the constant on time or the constant off time.

8. The power supply according to claim 1, wherein the third circuit comprises a comparator configured to: (1) when a preset electric current value ID in the third circuit is less than or equal to an output electric current ripple value ISL of the second linear circuit, enable the third circuit to work and provide the third electric current; and (2) when the preset electric current value ID in the third circuit is greater than or equal to the output electric current ripple value ISL of the second linear circuit, disable the third circuit to provide the third electric current.

9. The power supply according to claim 1, wherein the second linear circuit comprises a plurality of branches connected in parallel, and each branch linearly amplifies part of the high-power signals and provides a corresponding branch voltage according to the linearly-amplified part of the high-power signals; different branch voltages are superimposed to be provided as the second voltage to the radio-frequency power amplifier.

10. The power supply according to claim 5, wherein the first linear circuit comprises a first inductor, and the first linear circuit provides the first voltage to the radio-frequency power amplifier by using the third inductor, in the third circuit, having mutual inductance with the first inductor.

* * * * *